(12) United States Patent
Choi et al.

(10) Patent No.: US 6,317,351 B2
(45) Date of Patent: Nov. 13, 2001

(54) ASSOCIATIVE CACHE MEMORY CAPABLE OF RECONFIGURING A K-WAY AND N-SET CACHE MEMORY INTO A M-UNIT, K-WAY AND N/M-SET CACHE MEMORY

(75) Inventors: Hoon Choi, Seoul; Myung-Kyoon Yim, Sungnam-shi, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/800,685

(22) Filed: Mar. 7, 2001

(30) Foreign Application Priority Data

Mar. 13, 2000 (KR) .................................................. 00-12473

(51) Int. Cl.[7] ................................................... G11C 15/04
(52) U.S. Cl. ................. 365/49; 365/189.05; 365/189.07; 365/203; 365/204; 365/230.06; 365/190; 365/194

(58) Field of Search ................................. 365/49, 230.03, 365/189.05, 189.07, 203, 204, 230.06, 194, 190

(56) References Cited

U.S. PATENT DOCUMENTS

| | | | |
|---|---|---|---|
| 5,367,653 | * 11/1994 | Coyle et al. | 711/128 |
| 5,453,948 | * 9/1995 | Yoneda | 365/49 |
| 5,469,378 | * 11/1995 | Albon et al. | 365/49 |
| 5,859,791 | * 1/1999 | Schultz et al. | 365/49 |

* cited by examiner

Primary Examiner—Andrew Q. Tran
(74) Attorney, Agent, or Firm—F. Chau & Associates, LLP

(57) ABSTRACT

A K way cache memory having improved operational speed and reduced power consumption is provided. The cache memory includes M cache memory units, but only activates one of the units at a given time. Moreover, only one match line is activated corresponding to a way having a tag address that matches an externally provided tag address.

20 Claims, 10 Drawing Sheets

US 6,317,351 B2

ASSOCIATIVE CACHE MEMORY CAPABLE OF RECONFIGURING A K-WAY AND N-SET CACHE MEMORY INTO A M-UNIT, K-WAY AND N/M-SET CACHE MEMORY

BACKGROUND OF THE INVENTION

1. Technical Field

The present invention relates generally to cache memories and, more particularly, to an associative cache memory capable of decreasing power consumption through the reconfiguration of a K-way and N-set cache memory into M-unit, K-way, and N/M-set cache memory.

2. Description of Related Art

The majority of recent microprocessors employ an internal cache memory having a large storage for improving the performance of data access therein. The cache memory has a tag field composed of content addressable memory (CAM) cells and a data field composed of random access memory (RAM) cells. The tag field is accessed for determining whether a required command or data is stored within the current cache memory. This determination is performed whenever the processor fetches the command, or reads out or writes the data, by comparing an address held in itself with an input address. If the two addresses are the same, the cache memory reads out the command or data from the data field, or writes the data in the data field. As such activities with the tag field significantly affect the entire performance of the cache memory, aggressive developments relevant to the tag field in the cache memory have been taken to promote system performance. However, in the case of an embedded system such as a hand-held telephone, decreasing the power consumption is also very important.

FIG. 1 is a block diagram illustrating a general data processing system employing a cache memory, according to the prior art. The system of FIG. 1 is disclosed in U.S. Pat. No. 5,367,653, entitled "Reconfigurable Multi-Way Associative Cache Memory".

The data processing system includes a central processing unit (CPU) 100 which controls a main memory 200, and a multi-way associative cache memory 300. The main memory 200 and the cache memory 300 are usually a dynamic random access memory (DRAM), and a static random access memory (SAM), respectively. In a processing system, the cache memory 300 of an SRAM has a smaller storage capacity and a higher data access speed than the main memory 200 of a DRAM. Further, the cost per byte of the cache memory 300 is more expensive th an that of the ma in memory 200. As is known, CPU 100 also includes operational elements for data communications between an arithmetic logic unit (ALU), components of the CPU 100, and other circuit units.

The data and/or program command (represented as "data" hereinafter) can be stored in the cache memory 300. The data and an associative tag are stored in the cache memory 300. The address of the main memory 200 is stored in a main memory address register 110 located in the CPU 100.

The main memory address held in the main memory register 110 is divided into a few segments. That is, the main memory address includes byte selection address bits ADDR 0–1 used as a signal for selecting a single byte of a plurality of main memory bytes stored in the provided cache memory address, and word selection address bits ADDR 2–3 used as a signal for selecting a single word from a plurality of main memory words stored in the provided cache memory address. In addition, set select address bits ADDR 4–9 are used as a cache address for accessing a set of the cache memory 300. Tag address bits ADDR 10–31 represented as TAG are stored in a tag array of the cache memory 300. A cache memory controller 120 controls a signal transmission between the CPU 100 and the cache memory 300. The associative cache memory 300 is composed of tag and data arrays 320 and 340, respectively.

FIG. 2 is a diagram illustrating the associative cache memory 300 of FIG. 1 in further detail, according to the prior art. The associative cache memory 300 is a four-way set associative cache memory, including way_0 302, way_1 304, way_2 306, and way_3 308. Each way includes sixty-four sets. Since each way has the same circuit structure, only the structure of way_0 will be described.

The way 0_302 is formed of a buffer register 310, a tag array 320, a set selection unit 330, a data array 340, a set decoder 350, and a multiplexer 360.

The buffer register 310 latches the tag address bits ADDR 10–31 of the main memory address, provided by way of the cache memory controller 120. The address will be provided for a bit line signal of the tag array 320.

The tag array 320 is composed of 64 lines corresponding to SET_0 through SET_63, and each line stores 22 tag bits, respectively. Identical lines of the four ways 302, 304, 306, and 308 construct a single "set". That is, the first lines of the ways 302, 304, 306 and 308 are 'set_0', the second lines are "set_1", and so forth. Each line arranged in the tag array in a single way is referred to hereinafter 20 as a "set".

Match lines ML0~ML63 are connected to the sets SET_0~SET_63 of the tag array 320, respectively. The match line corresponding to the set of the tag array 320 which stores a tag equal to the address bits ADDR 10–31 latched in the buffer register 310 is set on a supply voltage level; the remaining match lines are set on a ground voltage level.

The set decoder 350 generates set enable signals SEN0 through SEN63 by decoding the set selection address bits ADDR 4–9.

The set selection unit 330 is formed of sixty-four transistors 330_0 through 330_63 connected between the match lines ML0~ML63 and the word lines DWL0~DWL63 of the data array 340. The transistors 330_0 to 330_63 selectively connect the match lines ML0~ML63 with the word lines DWL0~DWL63, responding to enable signals SEN0~SEN63 provided from the set decoder 350.

The data array 340 is composed of sixty-four sets as is the tag array 320. One set is composed of four words WORD0 through WORD3. Sets 340_0 through 340_63 of the data array 340 are connected to the sets of the tag arrays 320, through the word lines DWL0~DWL63, transistors 330_0~330_63, and the match lines ML0~ML63, respectively. The data array 340 provides the data, stored in the set associated with the activated word line of the world lines DWL 0 to DWL 63, to the multiplexer 360.

The multiplexer 360 selectively outputs one word (out of four words) provided from the data array 340 in response to the word selection address bits ADDR 2–3.

FIG. 3 is a diagram illustrating the tag array 320 of FIG. 2 in further detail, according to the prior art. The tag array 320 is constructed of a plurality of CAM cells 322 arranged in 64 rows and 22 columns. The word lines WL0~WL63 are arranged horizontally across pairs of bit lines BL0/BLB0~BL21/BLB21. The match lines ML0~ML63 are arranged parallel with the word lines WL0~WL63.

The pairs of bit lines BL0/BLB0~BL21/BLB21 transfer the tag address bits ADDR 10–31 stored in the buffer register 310 and the pair of data bits composed of complementary bits to the CAM cells 322. The CAM cells 322 store the single-bit data and perform the single-bit comparison (logical exclusive NOR (XNOR)) operation. The CAM cells 322 output the result of the comparison operation to the connected match line. Each of pre-charge transistors 324_0 through 324_63 is composed of a P-channel metal oxide semiconductor (PMOS) transistor, and includes a current path formed between the supply voltage and an end of the match line MLi(i=0,1, . . . or 63), a gate controlled by a pre-charge signal PRE provided from the cache memory controller 120.

FIG. 4 is a diagram illustrating the CAM 322 cell of FIG. 4 in further detail, according to the prior art. Referring to FIG. 4, the CAM cell 322 includes a N-channel metal oxide semiconductor (NMOS) transistor 402, and NMOS transistors 410 through 416, and a latch 404. During a pre-charge mode, the pre-charge transistor 324_0 through 340_63 is turned on in response to the pre-charge signal PRE, and the match line ML is pre-charged to high level. During an evaluation mode, it is evaluated whether or not data bits impressed on the pair of bit lines BL/BLB are identical with the data bits L1 and L2 stored in the latch 404. IF the data bits impressed on the pair of bit lines BL/BLB are identical with the data bits L1 and L2 stored in the latch 404, then the transistor 416 is turned off so that the match line ML keeps the pre-charged high level. In contrast, if the data bits impressed on the pair of bit lines BL/BLB are not identical with the data bits L1 and L2 stored in the latch 404, then the transistor 416 is turned on so that the match line ML is discharged to the ground voltage level. In this manner, the tag address bits ADDR 10–31 provided through the pairs of bit lines BL0/BLB0~BL21/BLB21 are compared with the data bits stored in the CAM cells 322, the match line associated with the complete identical set maintains the supply voltage level, and the rest of the match lines associated with the non-identical sets are discharged to the ground voltage level.

The cache memory 300 as described above performs the comparison operation in all the tag arrays 320 of four ways 302, 304, 306, and 308 by providing the main memory address bits ADDR 10–31 and ADDR 4–9 for all the four ways 302, 304, 306, and 308. In addition, in a single tag array 320, although the set to be compared with the main memory bits ADDR 10–31 is only one, all the match lines ML0~ML63 of 64 sets are pre-charged or discharged.

That is, the determination of a HIT/MISS is possible by performing the comparison operation in a single set of the ways corresponding to the set selection address bits ADDR 4–9; however, the comparison operation is performed in all the 64 sets. Therefore, in total, 256 match lines (4 ways×64 lines) perform the comparison operation, thereby causing unnecessary power dissipation.

To solve the aforementioned problems, U.S. Pat. No. 5,453,948, entitled "Associative Memory", and issued to Yoneda on Sep. 26, 1995, U.S. Pat. No. 5,469,378 entitled "Content Addressable Memory Having Match Line Transistors Connected in Series and Coupled to Current Sensing Circuit" issued to Albon et al. on Nov. 21, 1995, and U.S. Pat. No. 5,859,791 entitled "Content Addressable Memory" granted to Schultz et al. on Jan. 12, 1999 disclose the transistors, connected to a match line, in which the transistors are connected in series, not in parallel, and the end of the match line is connected to the ground voltage. Further, the transistor is turned on when the data stored in the latch is equal to the data provided through the bit line (HIT), while the transistor is turned off when the two data are unequal (MISS). Thus, in the case when all of the transistors connected to a match line are turned on, the other end of the match line connected to the data array decreases to the low level. Further, when even a single transistor is turned off, the match line maintains the high level of the pre-charge level. However, the manner of connecting the transistors to the match line in series lowers the operating speed. To improve the speed deterioration, in the patent of Albon et al., current sensing is used instead of voltage sensing, and in the patent of Schultz et al., the transistors in series are divided into a few blocks and the results of each of the blocks are combined. However, the manner of connecting the transistors with the match line in series has deficiencies such as an intricate circuit structure as well as an operating speed limit.

SUMMARY OF THE INVENTION

The present invention is directed to a cache memory having an improved operating speed and decreased power consumption with respect to the prior art.

According to a first aspect of the invention, there is provided a cache memory having K ways and N sets. The cache memory includes M (M<N) cache memory units. A unit selection decoder is adapted to generate unit selection signals to activate one of the M cache memory units at a given time in response to a unit selection address. Each of the cache memory units includes a tag array that, in turn, includes N/M sets. Each of the N/M sets is constructed of the K ways and has match lines respectively connected to the K ways. Further, each of the cache memory units includes a data array that, in turn, includes the N/M sets. Each of the N/M sets included in the data array is constructed of the K ways and has match lines respectively connected to the K ways. Also, each of the cache memory units includes a set selection decoder adapted to generate set selection signals to select one of the N/M sets in response to a set selection address. Additionally, each of the cache memory units includes a plurality of way selection decoders, each adapted to be enabled by a set selection signal corresponding thereto, and to generate way selection signals to select the K ways in a corresponding one of the N/M sets in response to a mode signal and a way selection address. The tag array is further adapted to compare tag addresses held in the K ways selected by a way selection signal with an external tag address, and to only activate a match line coupled to a way from among the K ways selected by the way selection signal to a first voltage level when a tag address held in the way and the external tag address are identical.

According to a second aspect of the invention, the tag array includes a plurality of content addressable memory (CAM) cells arranged in a plurality of rows and columns. A plurality of pairs of first and second bit lines are each adapted to transfer external tag addresses to the CAM cells in one of the plurality of columns. Ground lines are arranged in parallel with the match lines.

According to a third aspect of the invention, each of the plurality of CAM cells includes a pre-charge unit adapted to pre-charge a connected match line to the first voltage level in response to a pre-charge control signal. A discharge unit is adapted to discharge a connected ground line to a second voltage level in response to a given way selection signal provided from a corresponding one of the plurality of way selection decoders. A switching unit is adapted to selectively connect the connected match line with the connected ground line when a stored tag address is not identical to a given external tag address provided through one of the plurality of pairs of first and second bit lines.

According to a fourth aspect of the invention, each of the plurality of CAM cells further includes a latching unit adapted to store a binary value as a potential difference between first and second nodes. First and second transistors have a current path formed between one of the plurality of pairs of first and second bit lines, and a gate coupled to the first and second nodes, respectively.

According to a fifth aspect of the invention, the switching unit includes an N-channel metal oxide semiconductor (NMOS) transistor having a current path formed between the connected match line and the connected ground line and a gate coupled to a connecting node of the current paths of the first and second transistors.

According to a sixth aspect of the invention, the pre-charge unit includes a P-channel metal oxide semiconductor (PMOS) transistor having a current path formed between a supply voltage and the connected match line and a gate coupled to the pre-charge control signal.

According to a seventh aspect of the invention, the discharge unit includes an NMOS transistor having a current path formed between the connected ground line and a ground voltage, and a gate coupled to the given way selection signal provided from the corresponding one of the plurality of way selection decoders.

According to an eighth aspect of the invention, the data array further includes word lines respectively connected between the K ways of the data array and the match lines.

According to a ninth aspect of the invention, the cache memory further includes a word line driving circuit adapted to activate a word line connected to the match line that is coupled to the way, when the way selection signal, the match line coupled to the way, and a delay complementary signal corresponding to an operation delay time in the tag array are all activated.

According to a ninth aspect of the invention, the cache memory further includes a hit way sensing circuit adapted to generate hit way sensing signals respectively corresponding to the K ways, the hit way sensing signals corresponding to a state of activation of the word lines.

According to a tenth aspect of the invention, the hit way sensing circuit includes sensing lines respectively corresponding to the K ways. A plurality of sensing line pre-charge units are adapted to pre-charge the sensing lines to the first voltage level. A plurality of sensing line discharge units are adapted to discharge the sensing lines to a second voltage level, when at least one word line of a way connected to a sensing line corresponding thereto is activated. The voltage levels of the sensing lines are respectively provided by the hit way sensing signals.

According to a twelfth aspect of the invention, the sensing line discharge unit includes N/M discharge transistors each having a current path formed between a connected sensing line and the second voltage level, and a gate controlled by a given word line of a given way corresponding to the connected sensing line.

According to a thirteenth aspect of the invention, each of the plurality of way selection decoders is adapted to generate a given way selection signal to select all of the K ways in a given set when the mode signal corresponds to a read out mode, and to select one of the K ways in the given set based on a given way selection address when the mode signal corresponds to a write mode.

According to a fourteenth aspect of the invention, the tag array further includes a plurality of tag word lines respectively corresponding to the K ways in the N/M sets.

According to a fifteenth aspect of the invention, the CAM cell further includes a fourth transistor having a current path formed between the first node and a first bit line of the one of the plurality of pairs of first and second bit lines, and a gate coupled to one of the plurality of tag word lines. A fifth transistor has a current path formed between the second node and a second bit line of the one of the plurality of pairs of first and second bit lines, and a gate coupled to the one of the plurality of tag word lines.

As it is apparent from the foregoing, according to the cache memory of the invention, the cache memory is capable of remarkably decreasing the power consumption with high operating speed.

These and other aspects, features and advantages of the present invention will become apparent from the following detailed description of preferred embodiments, which is to be read in connection with the accompanying drawings.

These and other aspects, features, and advantages of the present invention will become apparent from the following detailed description of preferred embodiments, which is to be read in connection with the accompanying drawings.

DETAILED DESCRIPTION OF PREFERRED EMBODIMENTS

A preferred embodiment of the present invention will be described herein below with reference to the accompanying drawings. In the following detailed description, well-known functions or constructions are not described in detail so as not to obscure the invention in unnecessary detail.

Figure 5:
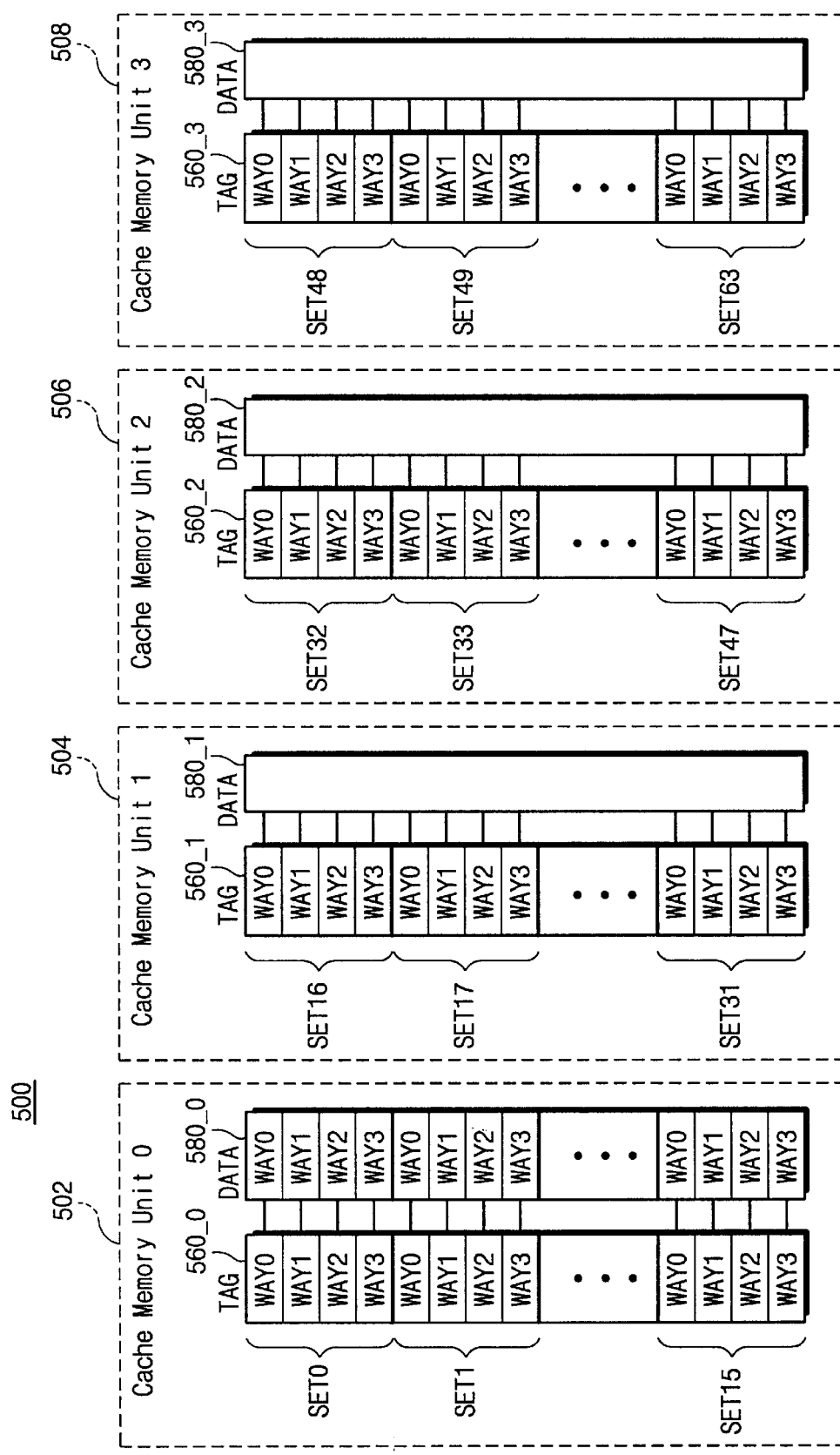
FIG. 5 is a schematic illustrating conceptually a structure of the cache memory according to a preferred embodiment of the present invention.

FIG. 5 is a schematic diagram illustrating the structure of a cache memory 500, according to a preferred embodiment of the present invention. The cache memory 500 includes 4 cache memory units 502 through 508. Each of the cache memory units 502~508 includes a tag array 560_y (y=0, 1, 2 or 3) and a data array 580_y (y=0, 1, 2, or 3). The tag array 560_y and the data array 580_y are respectively composed of 64 lines which are constructed of four ways and sixteen sets. That is, a single set includes four lines corresponding to 4 ways, respectively.

More specifically, the tag array 560_0 and data array 580_0 of the cache memory unit 0 502 are constructed of 16 sets in total from the set 0 to the set 15, and each of the sets includes 4 ways in total from the way 0 to the way 3. Each of the lines of the tag array 560_0 corresponds to the lines of the data array 580_0. Similar to the cache memory unit 0 502, the cache memory unit 1 504, the cache memory unit 2 506, and the cache memory unit 3 508 are also each constructed of 16 sets in total, with unit 1 504 being constructed from set 16 to set 31, unit 2 506 being constructed from set 32 to set 47, and unit 3 508 being constructed from set 48 to set 63. Further, each of the cache memory units 504~508 includes the tag array 560_y (y=1, 2, or 3) and data array 580_y (y=1, 2, or 3) constructed of the 16 sets as the foregoing.

Figure 1:
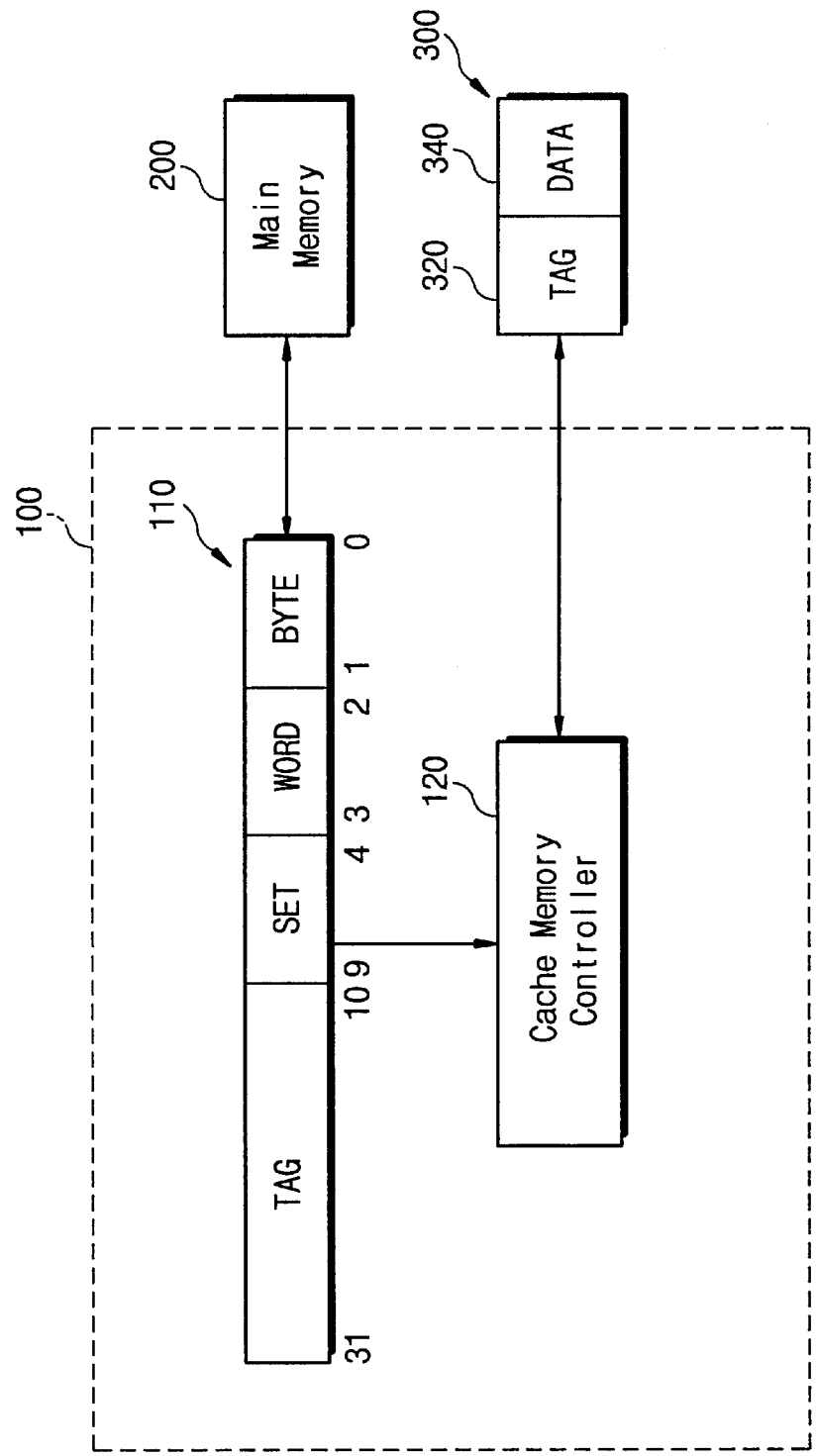
FIG. 1 is a block diagram illustrating a general data processing system employing a cache memory, according to the prior art.
Figure 2:
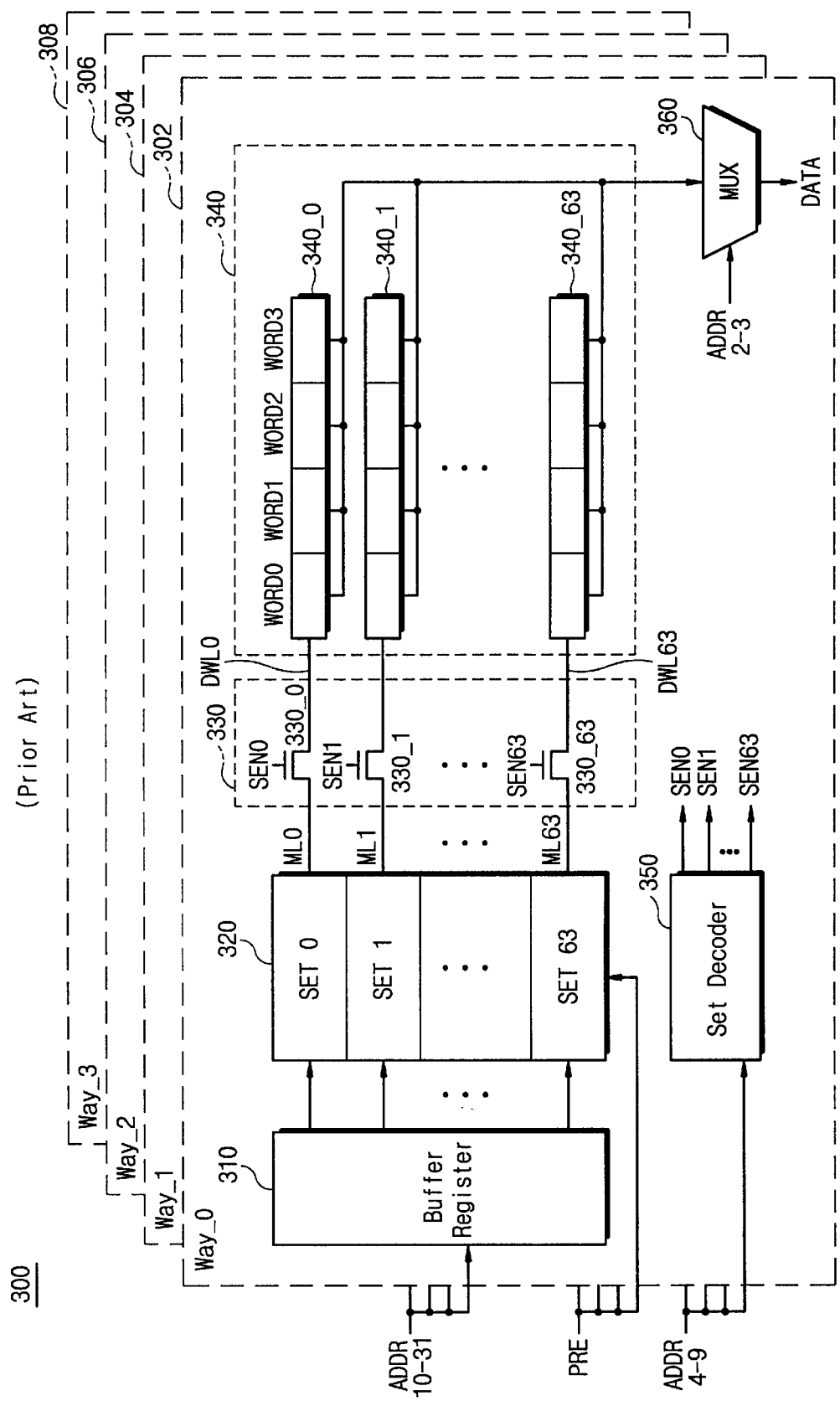
FIG. 2 is a diagram illustrating the associative cache memory of FIG. 1 in further detail, according to the prior art.
Figure 3:
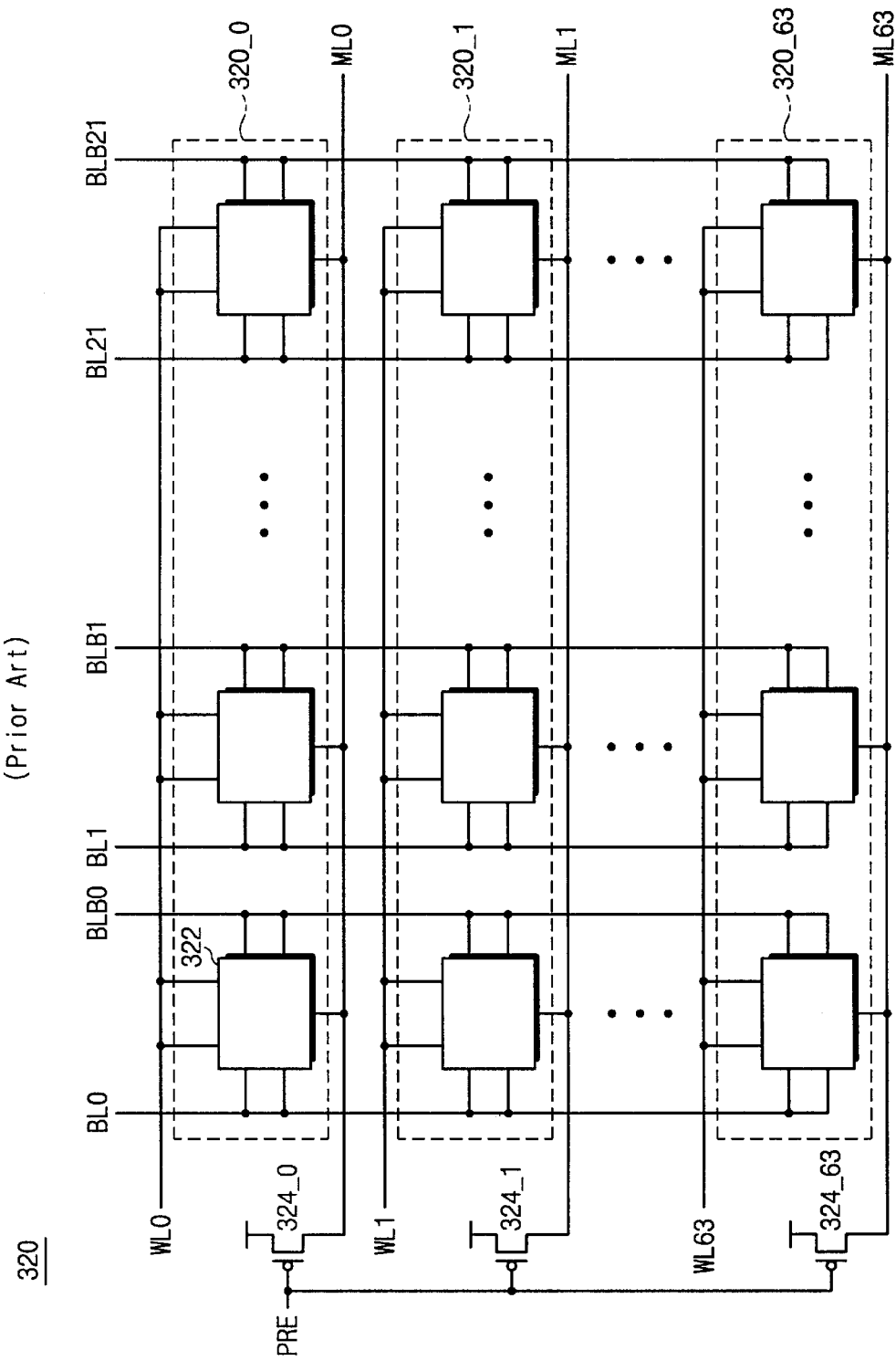
FIG. 3 is a diagram illustrating the tag array of FIG. 2 in further detail, according to the prior art.
Figure 4:
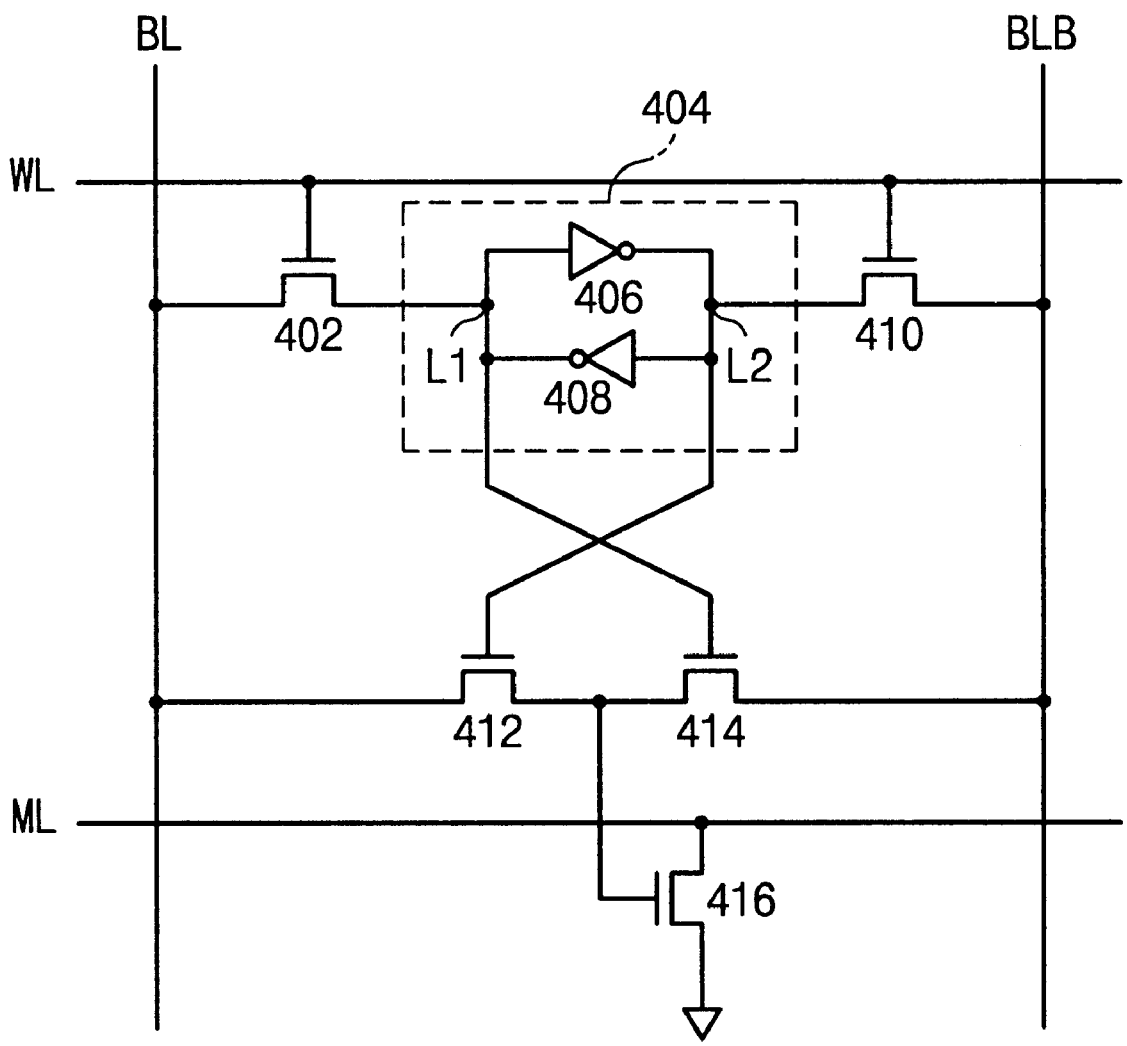
FIG. 4 is a diagram illustrating the CAM cell of FIG. 3 in further detail, according to the prior art.
Figure 6:
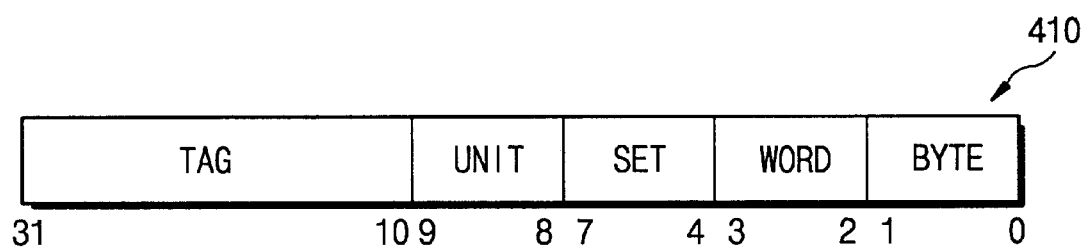
FIG. 6 is a schematic illustrating a structure of a main memory address register for accessing the cache memory constructed of 4 units, 4 ways, and 16 sets according to a preferred embodiment of the present invention.

FIG. 6 is a diagram illustrating a main memory address register 410 for accessing a cache memory having 4 units, 4 ways, and 16 sets, according to a preferred embodiment of the present invention. Compared with the conventional main memory address register 110 shown in FIG. 1, the known set selection bits ADDR 4–9 are divided into set selection bits ADDR 4–7 and unit selection bits ADDR 8–9 in the preferred embodiment of the present invention. The 4 cache memory units 502~508 are selectively operated by the unit selection bits ADDR 8–9.

Figure 7:
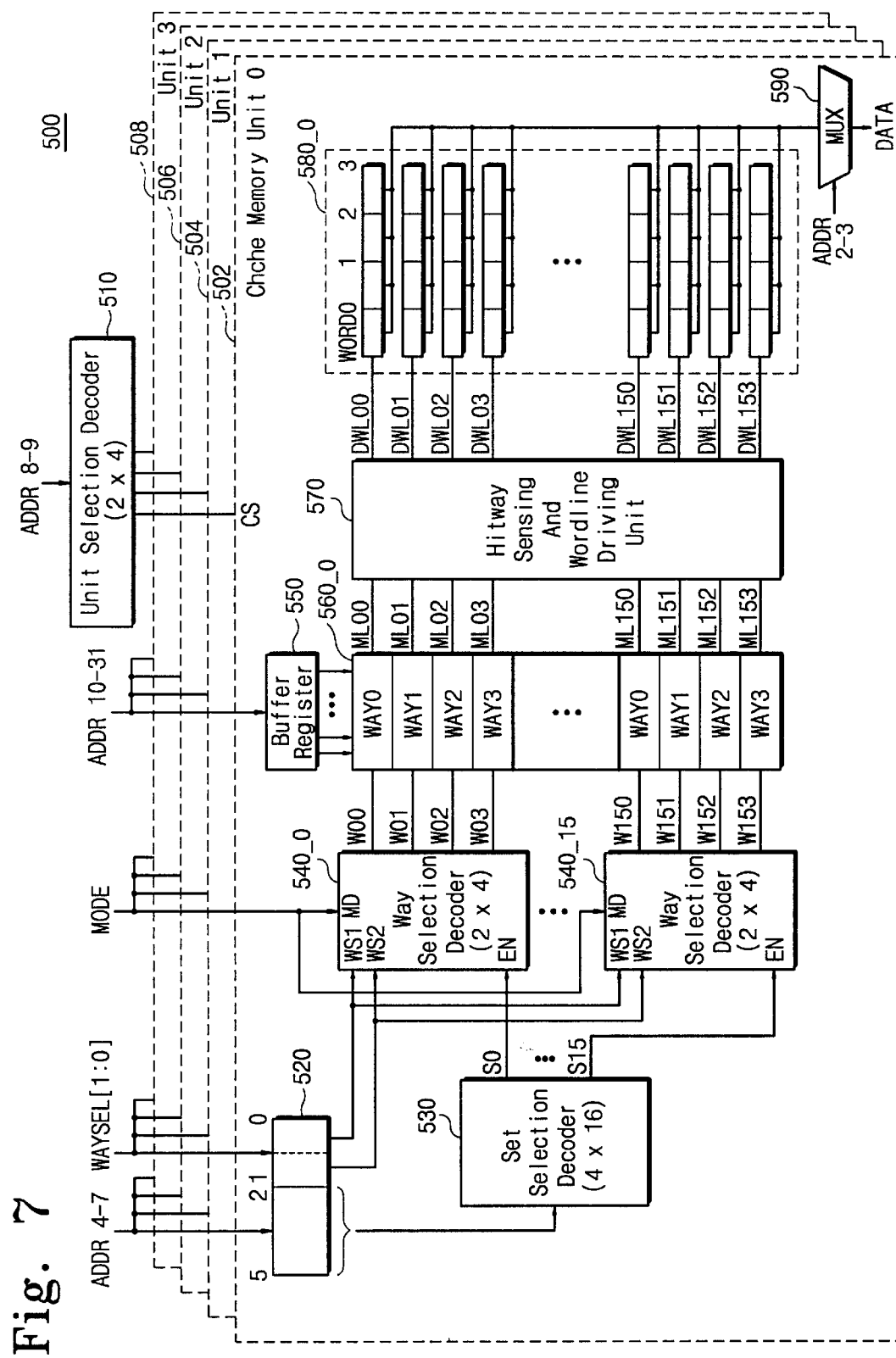
FIG. 7 is a block diagram illustrating a detailed structure of the cache memory according to a preferred embodiment of the present invention.

FIG. 7 is a block diagram illustrating the detailed structure of the cache memory, according to the preferred embodiment of the present invention. The cache memory 500 includes a unit selection decoder 510 which generates unit selection signals to select one of the cache memory units 502~508 in response to the unit selection address bits ADDR 8–9 of the main memory address. The cache memory units 502~508 operate when the unit selection signal provided through a chip selection terminal CS is in a state of activation, and do not operate when the signal is in a state of inactivation. Consequently, only one cache memory unit (corresponding to the unit selection address bits ADDR 8–9) of the 4 cache memory units 502~508 is in an operational mode, while the remaining 3 cache memory units do not operate.

Since all the cache memory units 502~508 have the same circuit structure and operation, only the cache memory unit 0 502 will be described in detail hereinafter to avoid redundant description of the invention.

The cache memory unit 0 502 includes a register 520, a set selection decoder 530, a way selection decoder 540_0 through 540_15, a buffer register 550, the tag array 560_0, a hit way sensing and word line driving unit 570, the data array 580_0, and a multiplexer 590.

The register 520 is composed of 6 register bits for storing the set selection address bits ADDR 4–7 of the main memory address and 2 way selection data bits WAYSEL [1:0] provided externally with respect to the cache memory. The set select decoder 530 generates set selection signals S0~S15 to select one of 16 sets by decoding the set address bits ADDR 4–7 held in the register 520.

Each of the way selection decoders 540_0~540_15 corresponds to one of the sets SET0 to SET15 of the tag array 560_0, and is enabled in response to the set selection signal corresponding thereto provided from the set selection decoder 530. The enabled way selection decoder 540*i* (i=0, 1, . . . , or 15) generates a way selection signal Wi0 to Wi3 (i=0, 1, . . . , or 15) to select all 4 ways in a single set in response to a mode signal MODE provided externally with respect to the cache memory, or to select a single way corresponding to the way selection data WAYSEL[1:0]. The mode signal MODE indicates a read out mode or a write mode. In the read out mode, the enabled way selection decoder 540*i* (i=0, 1, . . . , or 15) generates way selection signals to select all the 4 ways in the selected set. In the write mode, the way selection decoder 540*i* generates way selection signals to select one of 4 ways located in the corresponding set in response to the way selection address. In the read out mode, all the 4 ways in the selected set must be selected to determine whether or not there is a way storing the same tag with the tag address bits ADDR 10–31. In the write mode, only a single way, corresponding to the way selection data WAYSEL [1:0] provided externally, must be selected to store the tag in the way. The write operation of the cache memory is omitted, since the operation thereof can be fully understood by one of ordinary skill in the related art.

During the read out mode, the tag array 560_0 compares ways to determine whether or not one of the selected ways stores the tag corresponding to the tag address bits ADDR 10–31, and activates the match line connected to the way to a high level. The detailed circuit diagram of the tag array 560_0 is illustrated in FIG. 8.

Figure 8:
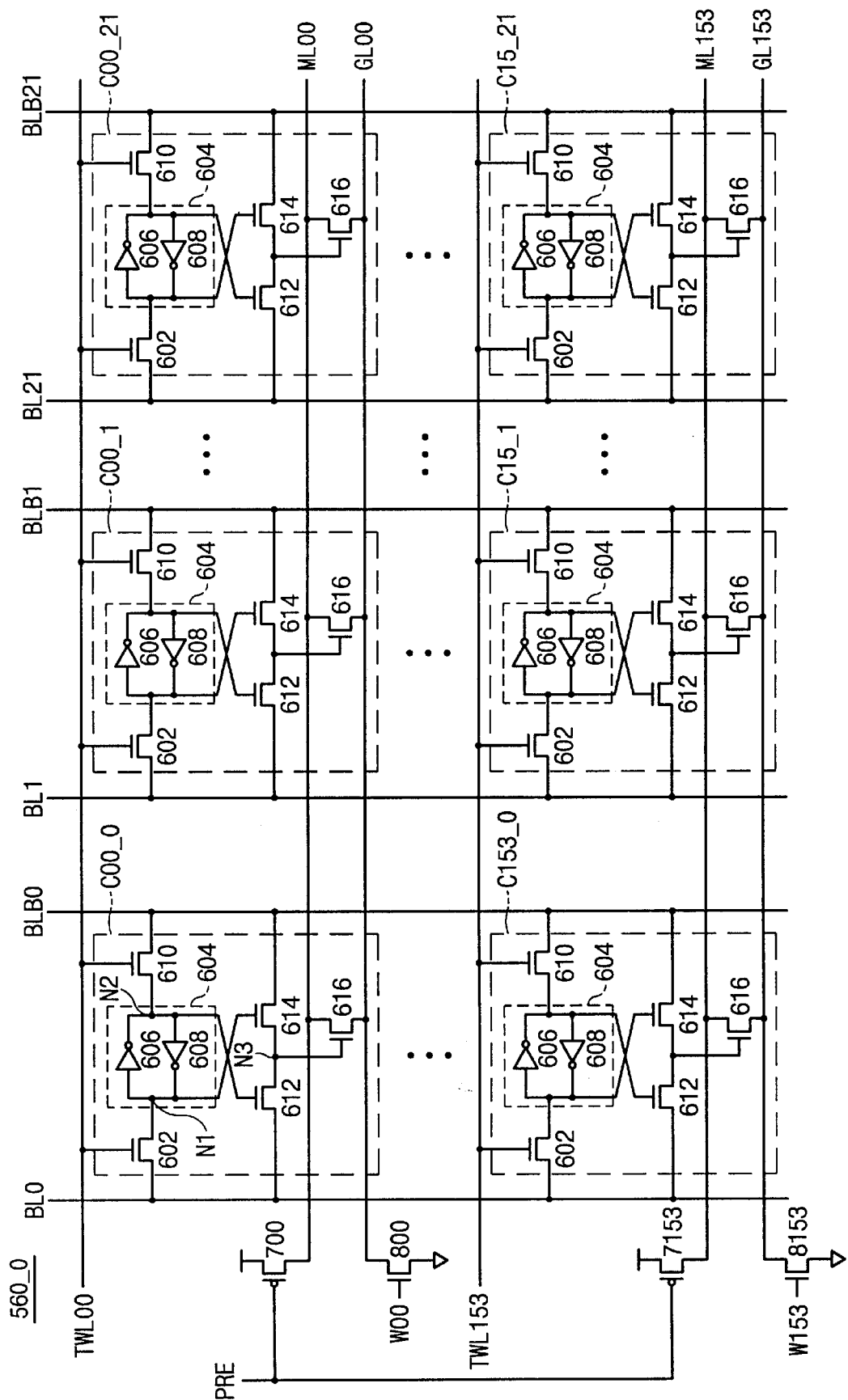
FIG. 8 is a detailed circuit diagram illustrating the tag array shown in FIG. 7.

Referring to FIG. 8, the tag array 560_0 includes: an array of content addressable memory (CAM) cells arranged in rows and columns; pairs of a first and second bit lines BL0/BLB0~BL21/BLB21; 64 match lines ML00~ML03, . . . , and ML150~ML153 corresponding to the rows (which all are not shown in FIG. 8); pre-charge transistors 700~7153, respectively connected to an end of the match lines, for pre-charging the connected match line to a supply voltage in response to a pre-charge control signal; 64 ground lines GL00~GL03, . . . , and GL151~GL153 arranged in parallel with respect to the match lines; and discharge transistors 800~8153, respectively connected to an end of the ground lines, for discharging a corresponding ground line to a ground voltage in response to a corresponding way selection signal.

The first bit lines BL0~BL 21 transfer the tag address bits ADDR 10–31 held in the buffer register 550 to an end of the CAM cells, and the second bit lines BLB0~BLB21 transfer the complementary bits with the tag address bits ADDR 10–31 to the other end of the CAM cells.

For the purpose of illustration, CAM cell C00_0 will now be described. The CAM cell C00_0 includes NMOS transistors 602, and 610 through 616, and a latch 604. The NMOS transistors 602 and 610 includes current paths connected between the first bit line BL0 and a first node N1, and the second bit line BLB0 and a second node N2, respectively, and gates coupled to a tag word line TWL00. The NMOS transistors 602 and 610 and the tag word line TWL00 are necessary elements for writing the data in the latch 604. The current paths of the NMOS transistors 612 and 614 are sequentially formed between the first bit line BL0 and the second bit line BLB0, and the gates thereof are coupled the second node N2 and the first node N1, respectively. The current path of the NMOS transistor 616 is formed between the match line ML00 and the ground line GL00, and the gate thereof is coupled to a connecting node N3 with respect to the NMOS transistors 612 and 614. As the remaining CAM cells of FIG. 8 have the same structure and operation as CAM cell C00_0, redundant description of the remaining CAM cells is omitted herein for purposes of brevity.

Figure 10:
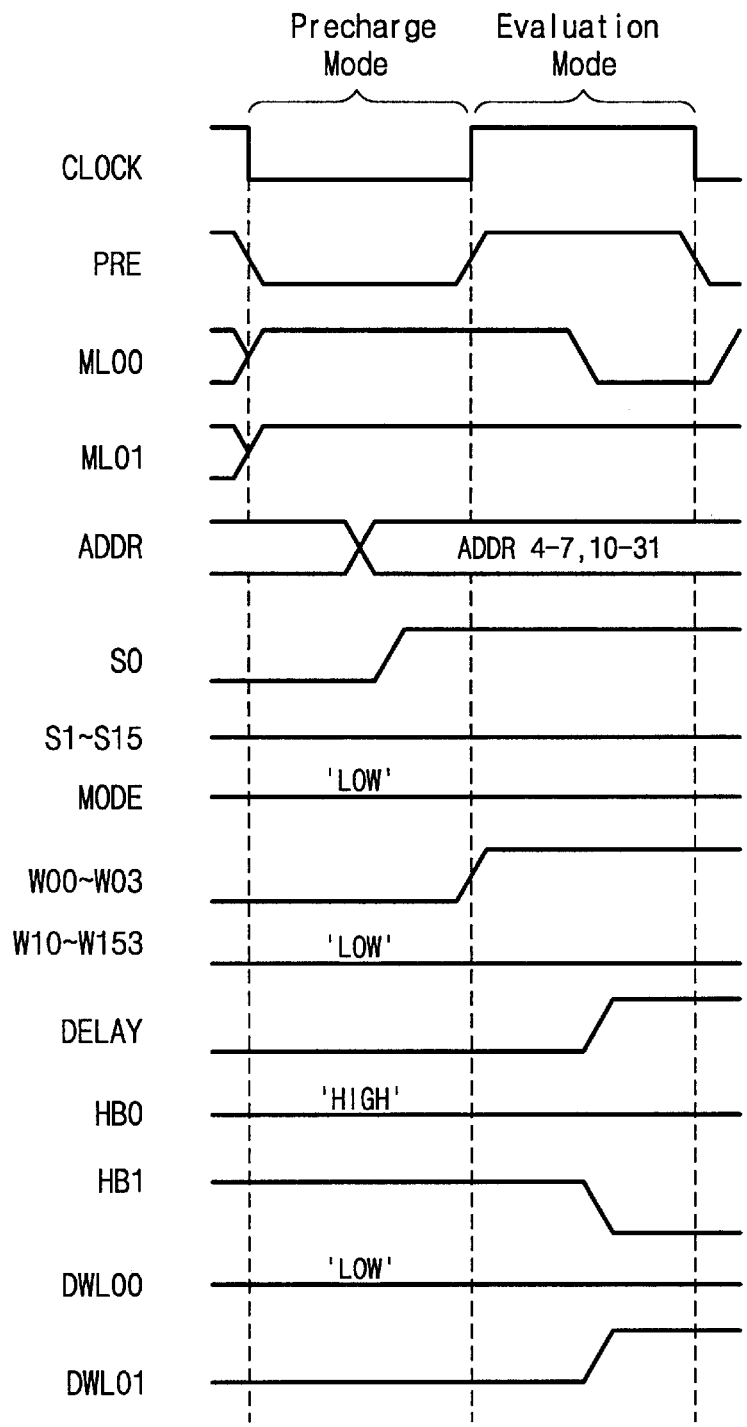
FIG. 10 is a timing diagram illustrating the cache memory in a read out mode according to a preferred embodiment of the present invention.

FIG. 10 is a timing diagram illustrating the cache memory in the read out mode according to a preferred embodiment of the present invention.

Referring to FIG. 8 and FIG. 10, in a pre-charge mode, when the pre-charge signal PRE is activated at a low level, the match lines ML00 to ML153 are pre-charged to the supply voltage by the pre-charge transistors 700~7153 being turned on. Continuously, one of 16 sets is selected by the set selection signals S0~S15 provided from the set selection decoder 530 shown in FIG. 7. The way selection decoder 540_i (i=0, 1, . . . , or 15) corresponding to the selected set generates the way selection signal activated at the high level to select all the 4 ways. For the purpose of illustration, presume that all the ways WAY0~-WAY3 of the set 0 are selected in the read out mode. In this case, the way selection signals W00 to W03 turn the discharge transistors 800~803 on, so that the match lines ML00~ML03 are connected to the ground voltage by way of the corresponding ground line GL0j (j=0, 1, 2, or 3) and the discharge transistor 80k (k=0, 1, 2, or 3), when the NMOS transistor 616 is turned on. As all the way selection signals Wi0~Wi3 (i=1,2, and 15) of unselected sets SET1 to SET 15 are inactivated at the low level, all the corresponding discharge transistors 811~8153 keep the turn-off state.

In the evaluation mode, when the tag address bits ADDR 10–31 and the complementary bits are provided through the first and second bit lines BL0/BLB0~BL21/BLB21, the NMOS transistor 616 is turned on or off depending on a binary value stored in the latch 604. That is, when the pairs of complementary tag address bits, provided though the first and second bit lines BL0/BLB0~BL21/BLB21, are equal to the binary value which is latched in both nodes N1 and N2 of the latch 604, the node N3 decreases to the low level so that the NMOS transistor 616 is turned off and the match line ML00 maintains the pre-charged high level. When the pairs of complimentary tag address bits are not equal to the binary value latched in nodes N1 and N2, the node N3 goes to the high level, so that the NMOS transistor 616 is turned on. When the NMOS transistor 616 is turned on, the match line ML00 is discharged to the ground voltage by way of the NMOS transistor 616, the ground line GL00, and the discharge transistor 800.

In this manner, the match line ML maintains the pre-charged supply voltage level when 22 binary value bits stored in the CAM cells which are connected to a match line are completely identical with the tag address bits ADDR 10–31. However, if even a single bit is not identical, then the match line ML is discharged through the ground line.

That is, a cache hit is represented by the match line maintaining the pre-charged supply voltage level after the evaluation mode, while a cache miss is represented by the match line being discharged to the ground voltage level.

As described above, 4 ground lines, respectively connected to 4 ways located in the set selected by the set selection address bits ADDR 6–9, are connected to the ground voltage by way of the discharge transistors. Meanwhile, 60 ground lines (except the 4 ground lines) keep floating. Consequently, only the 4 match lines connected to the selected 4 ground lines are discharged. Compared with the conventional cache memory in which all the match lines of 4 ways and 64 sets are discharged to determine the HIT/MISS of the cache access, in the present invention, remarkably small numbers of match lines are discharged to determine the HIT/MISS. Hence, the power consumed in determining the HIT/MISS is significantly decreased. Furthermore, though the cache memory of the present invention includes 4 units 502~508, only one corresponding to the unit selection address bits ADDR 8–9 is activated, so that only 4 lines are discharged as described above.

Figure 9:
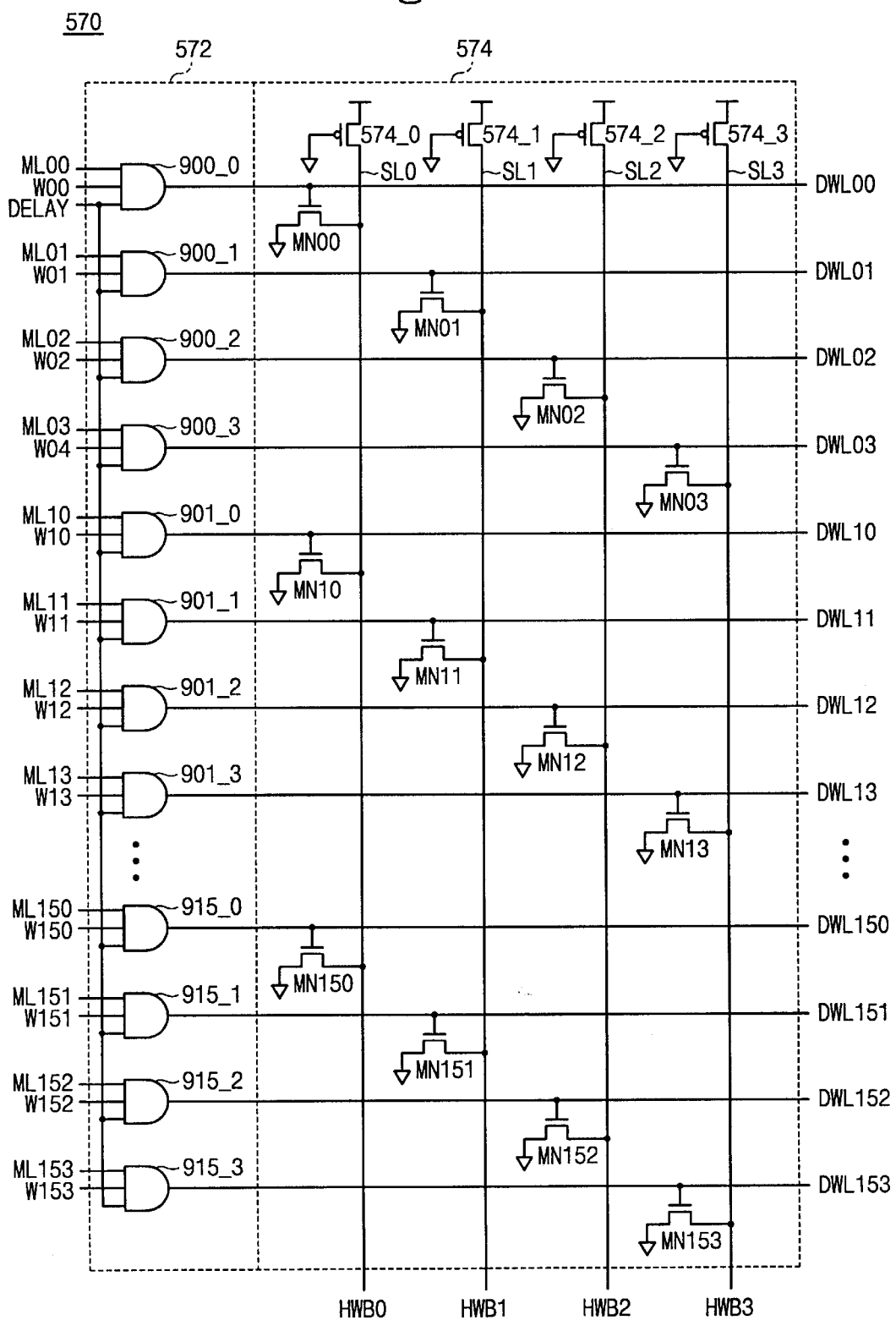
FIG. 9 is a detailed circuit diagram illustrating a hit way sensing and word line driving unit shown in FIG. 7.

FIG. 9 is a detailed circuit diagram illustrating the hit way sensing and word line driving unit 570 shown in FIG. 7. The hit way sensing and word line driving unit 570 is composed of a word line driving circuit 572 and a hit way sensing circuit 574. The word line driving circuit 572 includes 64 AND gates 900_0~900_3, . . . , and 915_0~915_3 respectively corresponding to the match lines ML00~ML153 of the tag array 560. The AND gates 900_0~900_3, . . . , and 915_0~915_3 perform an AND operation by accepting the voltage level of the corresponding match line ML00, ML01, . . . , or ML153, the corresponding way selection signal W00, W01, . . . , or W153, and a delay signal DELAY. The delay signal DELAY represents a delay time that is taken when the most remote CAM cell from the end gate discharges the connected match line in being miss-matched with the tag address bits. Output terminals of the AND gates 900_0~900_3, . . . , and 915_0~915_3 are coupled to the word lines DWL00~DW003, . . . , and DWL150~DWL153 of the data array 580.

Referring again to FIG. 7, the data array 580 has a structure of 4 words connected to a single word line. The data array 580 provides a data of 4 words stored in memory cells connected with the word line activated at the high level to the multiplexer 590. The multiplexer 590 selectively provides a single word corresponding the word selection address bits ADDR 2–3 from 4 words provided from the data array 580. It is possible to employ another multiplexer in the output terminal of the multiplexer 590 to selectively output one byte corresponding to the byte selection address bits ADDR 0–1.

Referring again to FIG. 9, the hit way sensing circuit 574 is connected to 4 sensing lines SL0~SL3 respectively corresponding to 4 ways, PMOS transistors 574_0~574_3 for pre-charging the respective sensing lines to the ground voltage, and the sensing lines, and is composed of NMOS transistors MN00~MN03, MN10~MN 13, . . . , and MN150~MN153 which discharge the connected sensing line to the ground voltage when one of the word lines in the way corresponding to the sensing line is activated.

Assuming that the tag stored in the way 1 is identical with the tag address bits ADDR 10–31 in the state of activation of all the way selection signals W00~W03 at the high level, provided from the way selection decoder 540_0. In that case, since the match line ML01 connected to the way 1 keeps the pre-charge level, the AND gate 900_1 activates the data word line DWL01 corresponding thereto at the high level after the delay complementary signal is activated to high. Since the match lines ML00, ML02 and ML03 connected to the rest of ways are discharged to the ground voltage, all the word lines DWL00, DWL02, DWL03, DLW 10~DWL13, . . . , and DWL151~DWL153 connected to the output terminals of the end gates 900_0, 900_2, 900_3, 901_0~900_3, . . . ,915-0~915-3 maintain the state of inactivation at the low level. Here, the NMOS transistor MN01 connected to the activated word line DWL01, of the NMOS transistors constructed in the hit way sensing circuit 574, is turned on, so that the sensing line SL1 is discharged in low level. Consequently, only the hit way sensing signal HWB1 which corresponds to the way 1 of the hit way sensing signals HWB0 to HWB3 is activated in low level, and the hit way sensing signals HWB0, HWB2, and HWB3 keep the state of inactivation in high level.

According to the present invention as the foregoing, in the state of the cache memory units selected by the unit selection address bits activating, only 4 ground lines, respectively connected to 4 ways located in the set selected by the set selection address bits, are connected to the ground voltage by way of the discharge transistors. Meanwhile, 60 ground lines except the 4 ground lines keep floating. Consequently, only 4 match lines connected to the selected 4 ground lines are discharged. Hence, the power consumption is far more decreased than that of the conventional art. Furthermore, the parallel connection of the transistors which are connected to the match line can improve the operating speed.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A cache memory having K ways and N sets, the cache memory comprising:

M (M<N) cache memory units; and a unit selection decoder adapted to generate unit selection signals to activate one of the M cache memory units at a given time in response to a unit selection address, wherein each of the cache memory units comprises:
a tag array including N/M sets, each of the N/M sets constructed of the K ways and having match lines respectively connected to the K ways;
a data array including the N/M sets, each of the N/M sets included in the data array constructed of the K ways and having match lines respectively connected to the K ways;
a set selection decoder adapted to generate set selection signals to select one of the N/M sets in response to a set selection address; and
a plurality of way selection decoders, each adapted to be enabled by a set selection signal corresponding thereto, and to generate way selection signals to select the K ways in a corresponding one of the N/M sets in response to a mode signal and a way selection address,
wherein the tag array is further adapted to compare tag addresses held in the K ways selected by a way selection signal with an external tag address, and to only activate a match line coupled to a way from among the K ways selected by the way selection signal to a first voltage level when a tag address held in the way and the external tag address are identical.

2. The cache memory as set forth in claim 1, wherein the tag array comprises:
a plurality of content addressable memory (CAM) cells arranged in a plurality of rows and columns;
a plurality of pairs of first and second bit lines, each of the plurality of pairs adapted to transfer external tag addresses to the CAM cells in one of the plurality of columns; and
ground lines arranged in parallel with the match lines.

3. The cache memory as set forth in claim 2, wherein each of the plurality of CAM cells comprises:
a pre-charge unit adapted to pre-charge a connected match line to the first voltage level in response to a pre-charge control signal;
a discharge unit adapted to discharge a connected ground line to a second voltage level in response to a given way selection signal provided from a corresponding one of the plurality of way selection decoders;
a switching unit adapted to selectively connect the connected match line with the connected ground line when a stored tag address is not identical to a given external tag address provided through one of the plurality of pairs of first and second bit lines.

4. The cache memory as set forth in claim 3, wherein each of the plurality of CAM cells further comprises:
a latching unit adapted to store a binary value as a potential difference between first and second nodes; and
first and second transistors having a current path formed between one of the plurality of pairs of first and second bit lines, and a gate coupled to the first and second nodes, respectively.

5. The cache memory as set forth in claim 4, wherein the switching unit comprises an N-channel metal oxide semiconductor (NMOS) transistor having a current path formed between the connected match line and the connected ground line and a gate coupled to a connecting node of the current paths of the first and second transistors.

6. The cache memory as set forth in claim 4, wherein the tag array further comprises a plurality of tag word lines respectively corresponding to the K ways in the N/M sets.

7. The cache memory as set forth in claim 6, wherein the CAM cell further comprises:
a third transistor having a current path formed between the first node and a first bit line of the one of the plurality of pairs of first and second bit lines, and a gate coupled to one of the plurality of tag word lines; and
a fourth transistor having a current path formed between the second node and a second bit line of the one of the plurality of pairs of first and second bit lines, and a gate coupled to the one of the plurality of tag word lines.

8. The cache memory as set forth in claim 3, wherein the pre-charge unit comprises a P-channel metal oxide semiconductor (PMOS) transistor having a current path formed between a supply voltage and the connected match line and a gate coupled to the pre-charge control signal.

9. The cache memory as set forth in claim 3, wherein the discharge unit comprises an NMOS transistor having a current path formed between the connected ground line and a ground voltage, and a gate coupled to the given way selection signal provided from the corresponding one of the plurality of way selection decoders.

10. The cache memory as set forth in claim 1, wherein the data array further comprises word lines respectively connected between the K ways of the data array and the match lines.

11. The cache memory as set forth in claim 6, wherein the cache memory further comprises a word line driving circuit adapted to activate a word line connected to the match line that is coupled to the way, when the way selection signal, the match line coupled to the way, and a delay complementary signal corresponding to an operation delay time in the tag array are all activated.

12. The cache memory as set forth in claim 10, wherein the cache memory further comprises a hit way sensing circuit adapted to generate hit way sensing signals respectively corresponding to the K ways, the hit way sensing signals corresponding to a state of activation of the word lines.

13. The cache memory as set forth in claim 12, wherein the hit way sensing circuit comprises:
sensing lines respectively corresponding to the K ways;
a plurality of sensing line pre-charge units adapted to pre-charge the sensing lines to the first voltage level; and
a plurality of sensing line discharge units adapted to discharge the sensing lines to a second voltage level, when at least one word line of a way connected to a sensing line corresponding thereto is activated, wherein the voltage levels of the sensing lines are respectively provided by the hit way sensing signals.

14. The cache memory as set forth in claim 13, wherein the sensing line discharge unit comprises N/M discharge transistors each having a current path formed between a connected sensing line and the second voltage level, and a gate controlled by a given word line of a given way corresponding to the connected sensing line.

15. The cache memory as set forth in claim 1, wherein each of the plurality of way selection decoders is adapted to generate a given way selection signal to select all of the K ways in a given set when the mode signal corresponds to a read out mode, and to select one of the K ways in the given set based on a given way selection address when the mode signal corresponds to a write mode.

16. A cache memory having K ways and N sets, the cache memory comprising:

M (M<N) cache memory units; and a unit selection decoder adapted to activate one of the M cache memory units at a given time in response to a unit selection address, wherein each of the cache memory units comprises:
- a tag array having N/M sets, each of the N/M sets having the K ways;
- a data array having the N/M sets, each of the N/M sets of the data array having the K ways;
- match lines respectively coupled to the K ways of the tag array and the data array;
- a set selection decoder adapted to select one of the N/M sets in response to a set selection address; and
- a plurality of way selection decoders, each adapted to select the K ways in an N/M set selected by the set selection decoder, wherein the tag array is further adapted to compare tag addresses held in the K ways selected by the set selection decoder with an external tag address, and to only activate a match line coupled to a way from among the K ways selected by the set selection decoder to a first voltage level when a tag address held in the way and the external tag address are identical.

17. The cache memory as set forth in claim 16, wherein the tag array comprises:
- a plurality of content addressable memory (CAM) cells arranged in a plurality of rows and columns;
- a plurality of pairs of first and second bit lines, each of the plurality of pairs adapted to transfer external tag addresses to the CAM cells in one of the plurality of columns; and
- ground lines arranged in parallel with the match lines.

18. The cache memory as set forth in claim 17, wherein each of the plurality of way selection decoders is further adapted to generate way selection signals to select the K ways in the N/M sets, and each of the plurality of CAM cells comprises:
- a pre-charge unit adapted to pre-charge a connected match line to the first voltage level in response to a pre-charge control signal;
- a discharge unit adapted to discharge a connected ground line to a second voltage level in response to a way selection signal generated by a corresponding one of the plurality of way selection decoders,
- a switching unit adapted to selectively connect the connected match line with the connected ground line when a stored tag address is not identical to a given external tag address provided through one of the plurality of pairs of first and second bit lines.

19. The cache memory as set forth in claim 18, wherein each of the plurality of CAM cells further comprises:
- a latching unit adapted to store a binary value as a potential difference between first and second nodes; and
- first and second transistors having a current path formed between one of the plurality of pairs of first and second bit lines, and a gate coupled to the first and second nodes, respectively.

20. The cache memory as set forth in claim 19, wherein the switching unit comprises an N-channel metal oxide semiconductor (NMOS) transistor having a current path formed between the connected match line and the connected ground line and a gate coupled to a connecting node of the current paths of the first and second transistors.

* * * * *